(12) United States Patent
Liou

(10) Patent No.: US 6,995,073 B2
(45) Date of Patent: Feb. 7, 2006

(54) AIR GAP INTEGRATION

(75) Inventor: Huey-Chiang Liou, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 117 days.

(21) Appl. No.: 10/621,696

(22) Filed: Jul. 16, 2003

(65) Prior Publication Data

US 2005/0012219 A1    Jan. 20, 2005

(51) Int. Cl.
*H01L 21/76* (2006.01)
*H01L 21/4763* (2006.01)
*H01L 29/00* (2006.01)
*H01L 23/48* (2006.01)
*H01L 23/52* (2006.01)

(52) U.S. Cl. ............... 438/421; 438/619; 438/629; 438/618; 438/637; 438/627; 438/634; 257/522; 257/758; 257/774

(58) Field of Classification Search ............... 438/421, 438/619, 618, 629, 637, 627, 634, 622; 257/522, 257/622, 758, 774
See application file for complete search history.

(56) References Cited

U.S. PATENT DOCUMENTS

| | | | |
|---|---|---|---|
| 6,413,852 B1 * | 7/2002 | Grill et al. | 438/619 |
| 6,689,680 B2 * | 2/2004 | Greer | 438/614 |
| 6,696,222 B2 * | 2/2004 | Hsue et al. | 430/313 |
| 6,713,835 B1 * | 3/2004 | Horak et al. | 257/522 |
| 2003/0127740 A1 * | 7/2003 | Hsu et al. | 257/758 |

* cited by examiner

*Primary Examiner*—Nitin Parekh
(74) *Attorney, Agent, or Firm*—Michael D. Plimier

(57) ABSTRACT

Method and structure for integrating conductive and dielectric materials in a microelectronic structure having air gaps are disclosed. Certain embodiments of the invention comprise isolating dielectric layers from conductive layers using an etch stop layer to facilitate controlled removal of portions of the dielectric layers and formation of air gaps or voids. Capping and peripheral structural layers may be incorporated to increase the structural integrity of the integration subsequent to removal of sacrificial material.

25 Claims, 15 Drawing Sheets

AIR GAP INTEGRATION

BACKGROUND OF THE INVENTION

Low dielectric constant materials are used as interlayer dielectrics in microelectronic devices, such as semiconductor-devices, to reduce the resistance-capacitance ("RC") delay and improve device performance. As device sizes continue to shrink, the dielectric constant ("k") of the material between metal lines must also decrease to maintain the improvement. Certain low-k materials have been proposed, including various carbon-containing materials such as organic polymers and carbon-doped oxides. The eventual limit for a dielectric constant is k=1, which is the value for a vacuum. Methods and structures have been proposed to incorporate void spaces or "air gaps" in attempts to obtain dielectric constants closer to k=1. One major issue facing air gap technology is how to remove sacrificial material to facilitate multi-layer structures. Another major issue facing air gap technology is how to facilitate air gap creation while providing a structure which can withstand modern processing steps, such as chemical-mechanical polishing and thermal treatment, as well as post processing mechanical and thermo-mechanical rigors.

BRIEF DESCRIPTION OF THE DRAWINGS

The present invention is illustrated by way of example and is not limited in the figures of the accompanying drawings, in which like references indicate similar elements. Features shown in the drawings are not intended to be drawn to scale, nor are they intended to be shown in precise positional relationship.

DETAILED DESCRIPTION

In the following detailed description of embodiments of the invention, reference is made to the accompanying drawings in which like references indicate similar elements. The illustrative embodiments described herein are disclosed in sufficient detail to enable those skilled in the art to practice the invention. The following detailed description is therefore not to be taken in a limiting sense, and the scope of the invention is defined only by the appended claims.

Figure 1A:
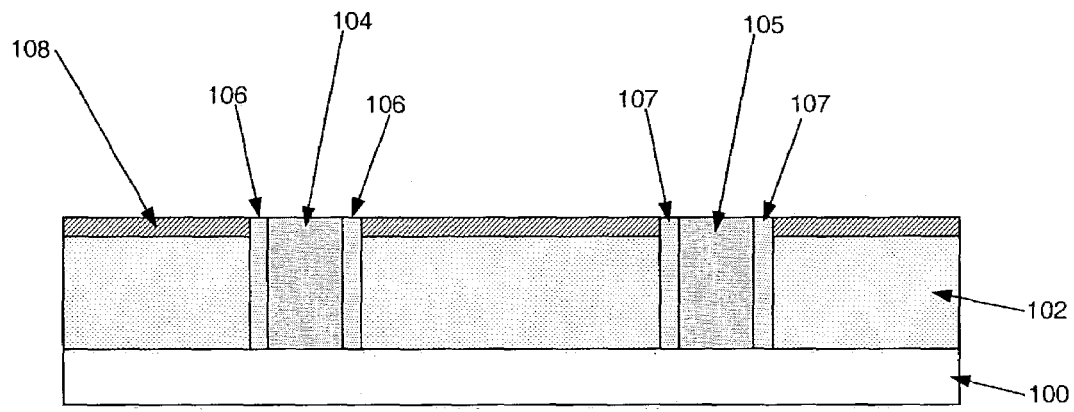
FIGS. 1A–1L depict cross-sectional views of various aspects of one embodiment of the present invention.

Referring to FIG. 1A, a microelectronic structure, such as a semiconductor structure, is depicted having a substrate layer (100) adjacent a dielectric layer (102), which is positioned between an etch stop layer (108) and the substrate layer (100). The dielectric layer (102) and etch stop layer (108) are cross sectionally interrupted by via conductive layers (104, 105) crossing the dielectric layer (102) and etch stop layer (108). Each of the via conductive layers (104, 105) is isolated from the dielectric layer (102) and etch stop layer (108) by a barrier layer (106) which also crosses the dielectric layer (102) and etch stop layer (108). Such a microelectronic structure may be recognizable as the bottom portion of a conventional semiconductor interconnect integration.

The substrate layer (100) may comprise any surface generated when making an integrated circuit, upon which a conductive layer may be formed. Substrate (100) thus may comprise, for example, active and passive devices that are formed on a silicon wafer, such as transistors, capacitors, resistors, diffused junctions, gate electrodes, local interconnects, etcetera. Substrate (100) may also comprise insulating materials (e.g., silicon dioxide, either undoped or doped with phosphorus or boron and phosphorus; silicon nitride; silicon oxynitride; or a polymer) that separate active and passive devices from the conductive layer or layers that are formed adjacent them, and may comprise other previously formed conductive layers.

The etch stop layer (108) preferably comprises a material, such as silicon nitride or another known etch stop material appropriately matched with the etchability of adjacent layers, which selectively does not substantially etch when the layer above (110 in FIG. 1B, for example) is being etched. The etch stop layer (108) may be deposited using conventional chemical vapor deposition ("CVD"), plasma enhanced CVD ("PECVD"), or low-pressure CVD techniques, as are well known in the art, at a thickness preferably between about 10 nanometers and about 200 nanometers.

The barrier (106) and via conductive (104, 105) layers may be formed using conventional patterning, trenching, barrier deposition, and conductive material deposition techniques, as would be apparent to one skilled in the art. In one embodiment, for example, subsequent to patterning and trenching, a thin barrier layer (106) is deposited using conventional techniques such as CVD or PECVD, after which conductive material is deposited using electroplating techniques. The via conductive layers (104, 105) preferably comprise a highly conductive material, such as tungsten or copper or other conventionally utilized interconnect conductive materials, and the barrier layer (106) comprises a material such as silicon carbide, tantalum nitride, or titanium nitride which is appropriated matched with the selected conductive material for the via conductive layers (104, 105), as would be apparent to one skilled in the art.

Figure 1B:
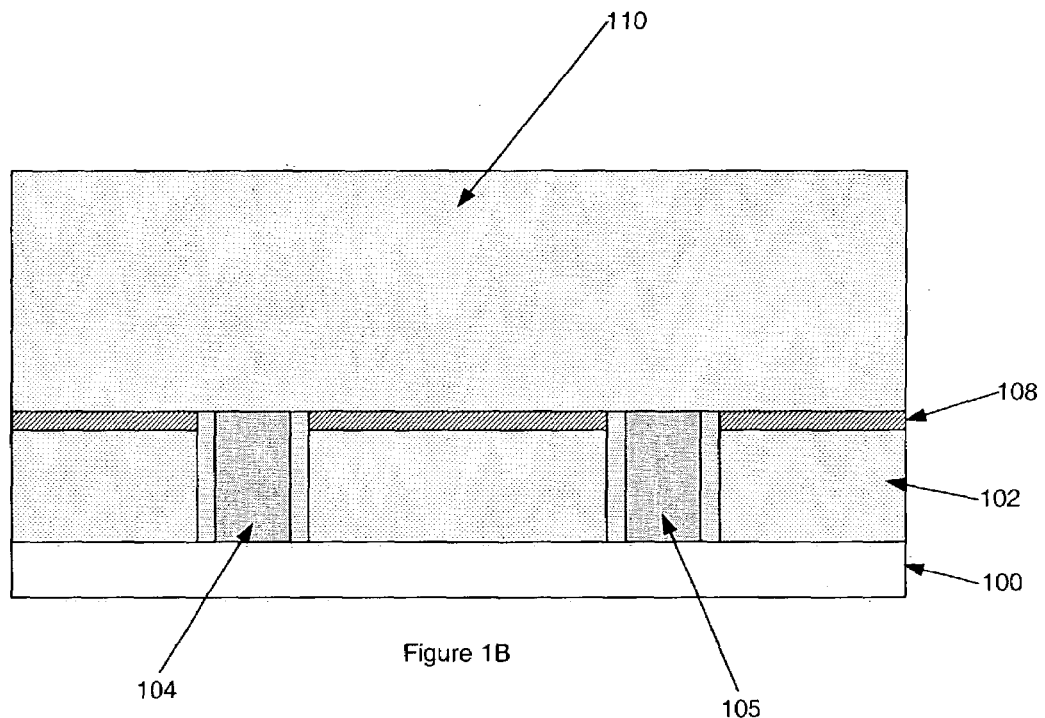

Referring to FIG. 1B, subsequent to formation of the structures depicted in FIG. 1A, a sacrificial dielectric layer (10) may be deposited. The sacrificial dielectric layer (10) preferably comprises silicon dioxide, silicon oxynitride, silicon oxyfluoride, or a polymeric dielectric material. Suitable polymeric dielectric materials for the sacrificial dielectric layer (10) include but are not limited to polynorbornene-based polymers, such as that sold under the trade name "Unity400™", distributed by Promerus LLC; polycyclohexene; the co-polymer of polypropylene oxide and polyethylene oxide; polystyrene; poly(p-phenylene); polyxylene; cross-linked polymethylmethacrylate ("PMMA"); polyarylene-based polymeric dielectrics such as that sold under the trade name "SiLK™", distributed by Dow Chemical Corporation; poly(aryl ether)-based polymeric dielectrics such as that sold under the trade name "FLARE™", distributed by Honeywell Corporation; and polyarylene-based spin-on dielectrics such as that sold under the trade name "GX-3™", also from Honeywell Corporation. Depending upon the material selected for this and other associated layers, such as the conductive layer (142) discussed below in reference to FIG. 1H, the sacrificial dielectric layer (110) may be deposited using conventional techniques, such as spin-on, chemical vapor deposition ("CVD"), plasma-enhanced chemical vapor deposition ("PECVD"), evaporative deposition, or physical vapor deposition ("PVD") to form a layer having a thickness between about 200 nanometers and about 1,500 nanometers. In the case of spin-on or other deposition techniques, solvent may need to be removed by evaporative techniques familiar to those skilled in the art.

Figure 1C:
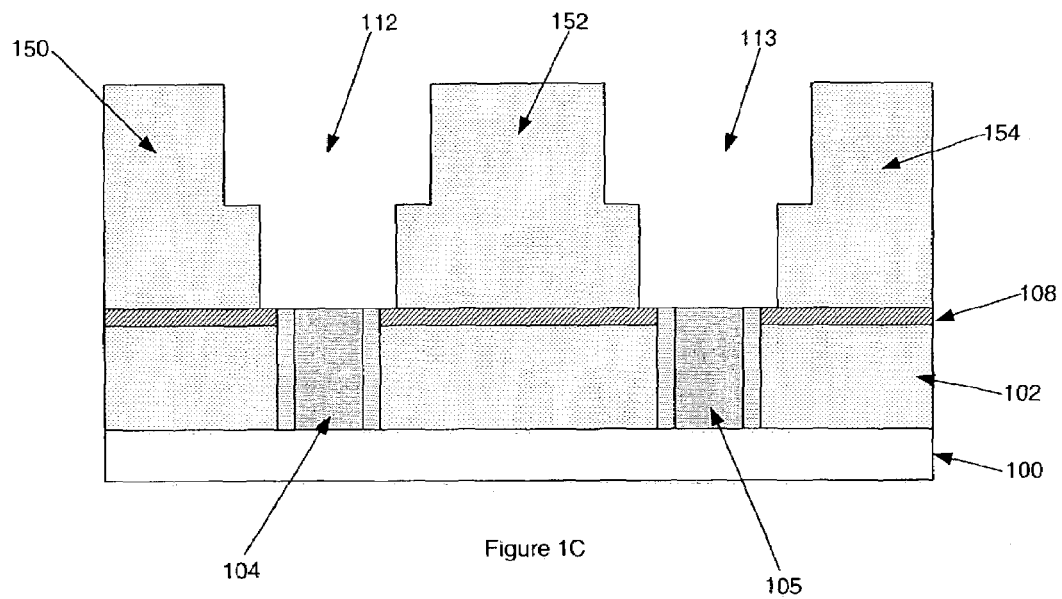
Figure 1D:
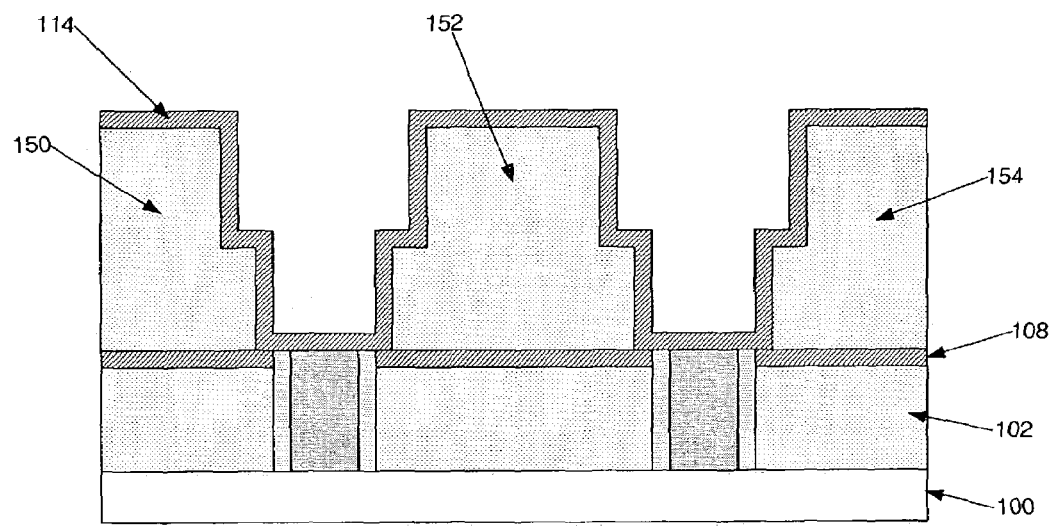

Referring to FIG. 1C, conventional patterning and etching techniques may be utilized to form trenches (112, 113) which subdivide the sacrificial dielectric material into distinct sacrificial layer portions (150, 152, 154), as depicted in the cross sectional view of FIG. 1C. Subsequent to formation of the trenches (112, 113), an etch stop layer (114) is deposited, as shown in FIG. 1D The etch stop layer (114) provides a similar function as the previously described etch stop layer (108), and may comprise a similar material. For example, the etch stop layer (114) may comprise silicon nitride, deposited using conventional conformal CVD or PECVD techniques.

Figure 1E:
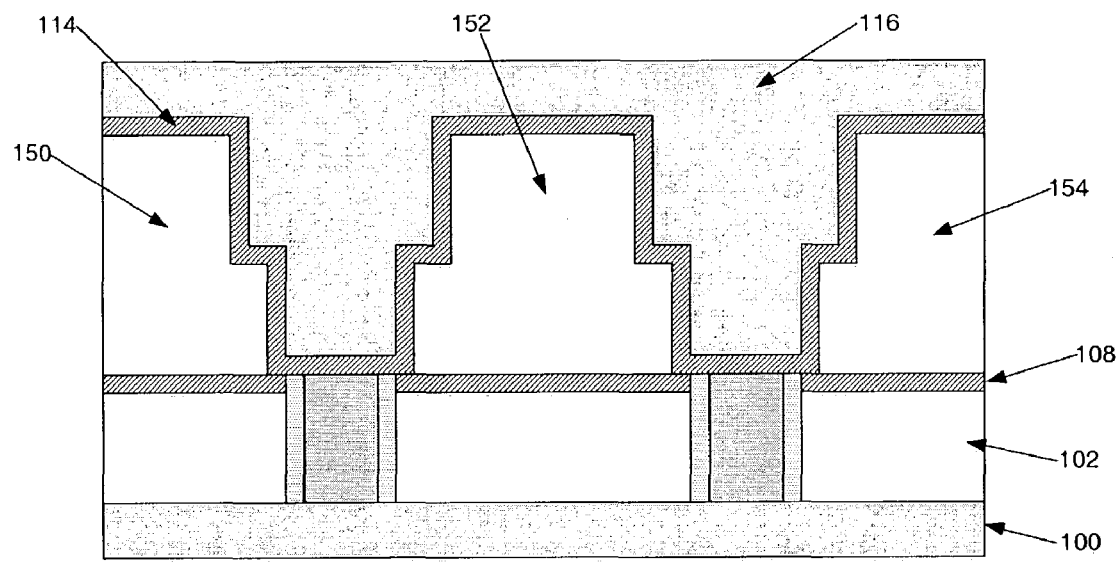
Figure 1F:
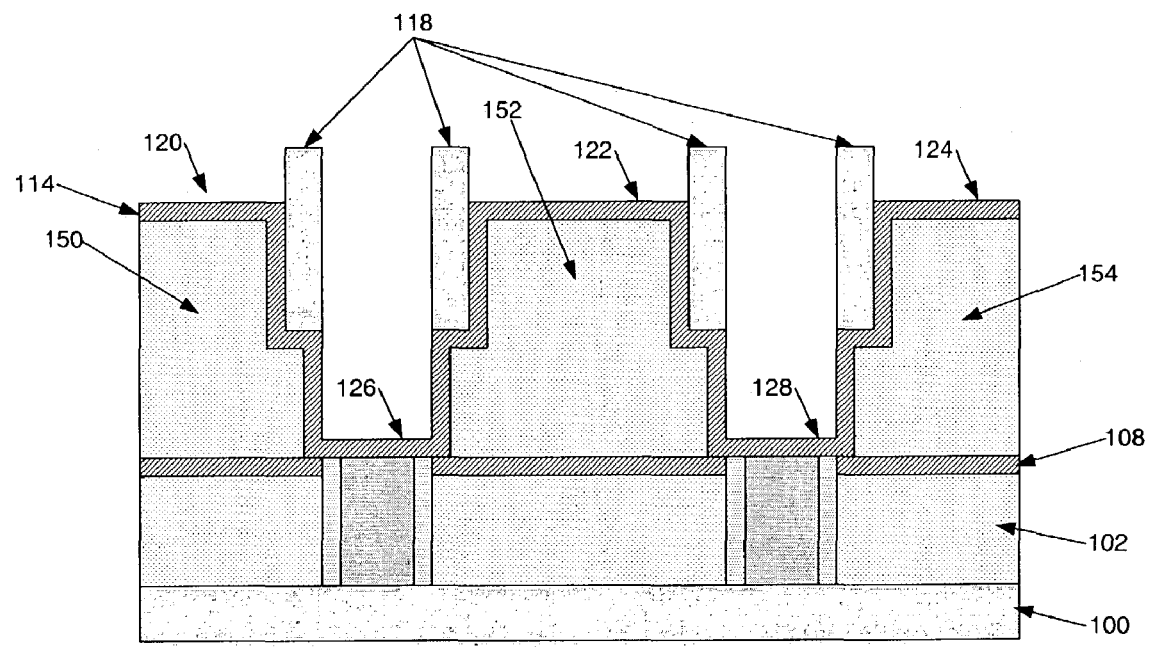
Figure 1G:
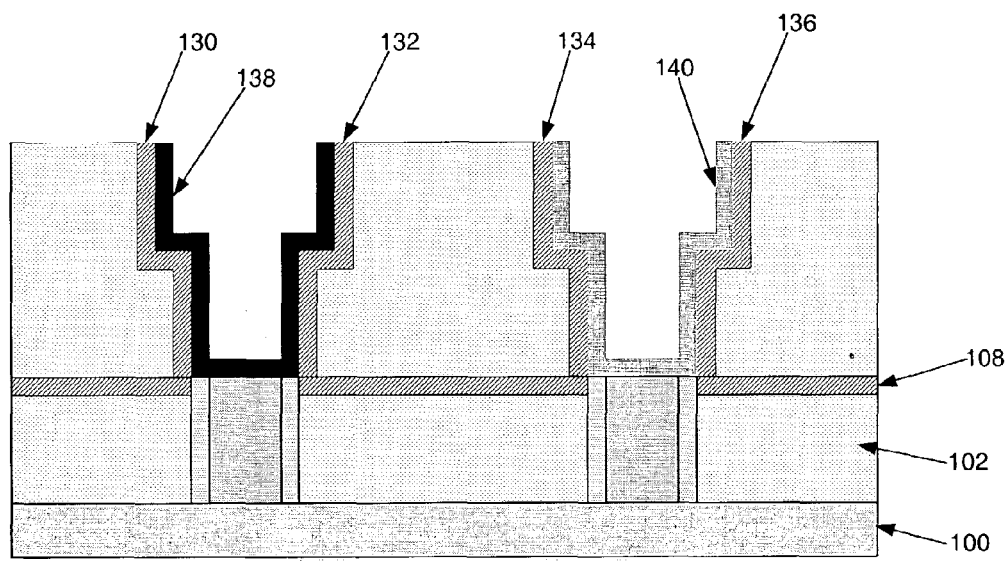
Figure 1H:
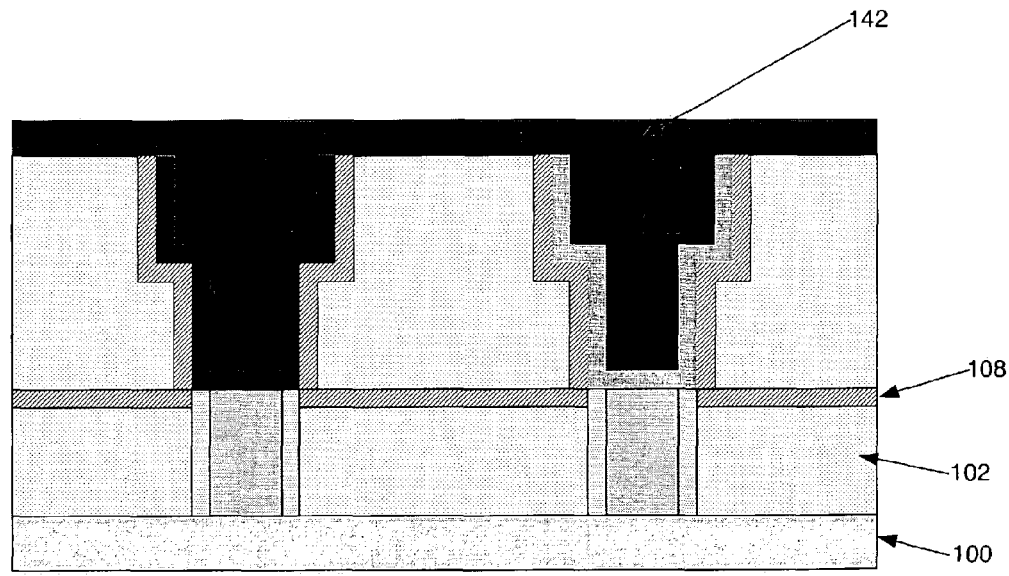

Referring to FIG. 1E, a structure similar to that of FIG. 1D is depicted, with the exception that a photoresist layer (116) has been deposited adjacent the etch stop (114) layer. The photoresist layer (116) preferably comprises a conventional polymeric photoresist material, such as those based upon the poly(norbornene) polymeric backbone with photoactive sidegroups, which may be deposited as depicted using spin-on techniques. Referring to FIG. 1F, the photoresist layer of FIG. 1E (116) may be converted to a patterned photoresist layer (118) using conventional techniques to facilitate removal of targeted portions (120, 122, 124, 126, 128) of the etch stop layer (114). Referring to FIG. 1G, subsequent to etching and removal of the patterned photoresist layer (118), barrier layers (138, 140) are formed adjacent the remaining etch stop layer portions (130, 132, 134, 136) and via conductive layers (104, 105). These barrier layers (138, 140) may comprise a conventional barrier material associated with the material selected for the subsequently deposited conductive layer (142), as depicted in FIG. 1H. In one embodiment, for example, the conductive layer (142) comprises copper, deposited using conventional electroplating techniques, and the barrier layers (138, 140) comprise tantalum nitride, titanium nitride, or other barrier or shunt materials conventionally paired with copper, such as cobalt, to isolate the copper from adjacent dielectric materials, deposited using conventional techniques such as CVD or PECVD.

Figure 1I:
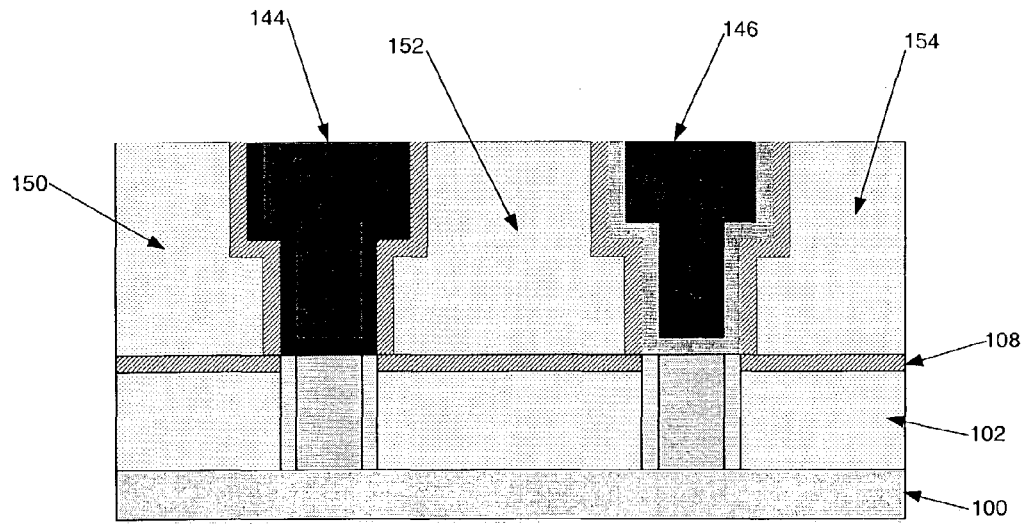
Figure 1J:
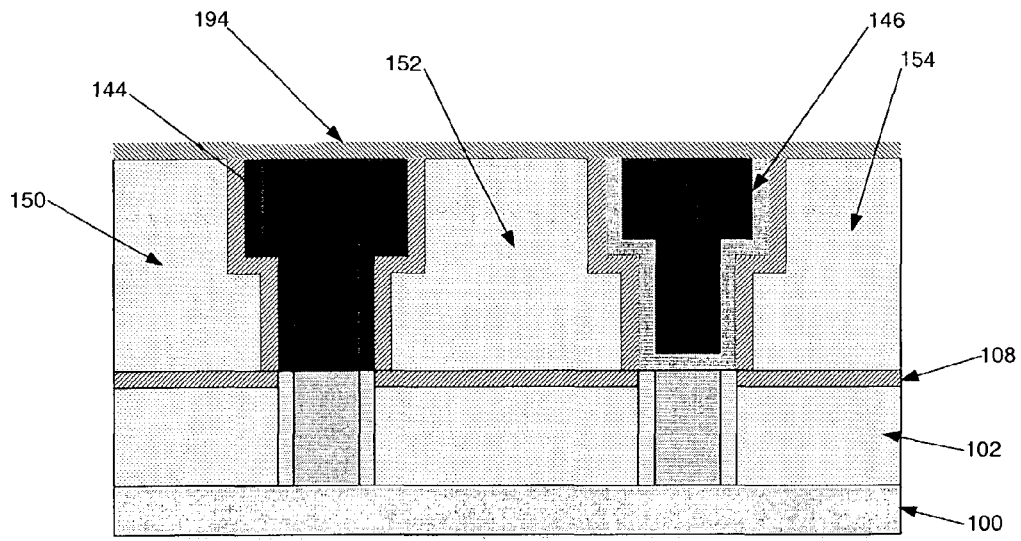
Figure 1K:
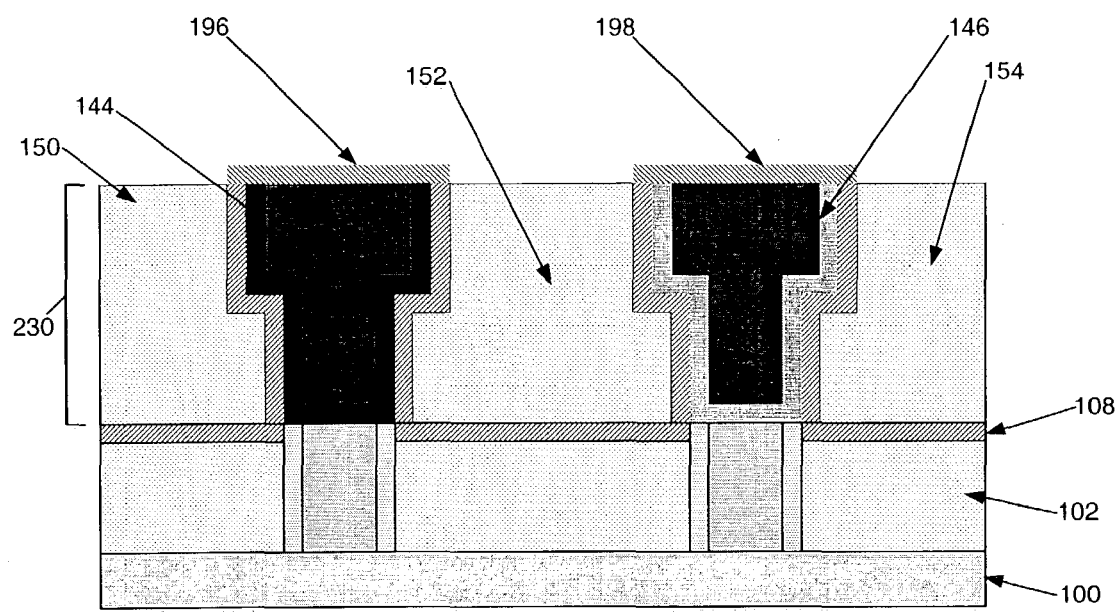
Figure 1L:
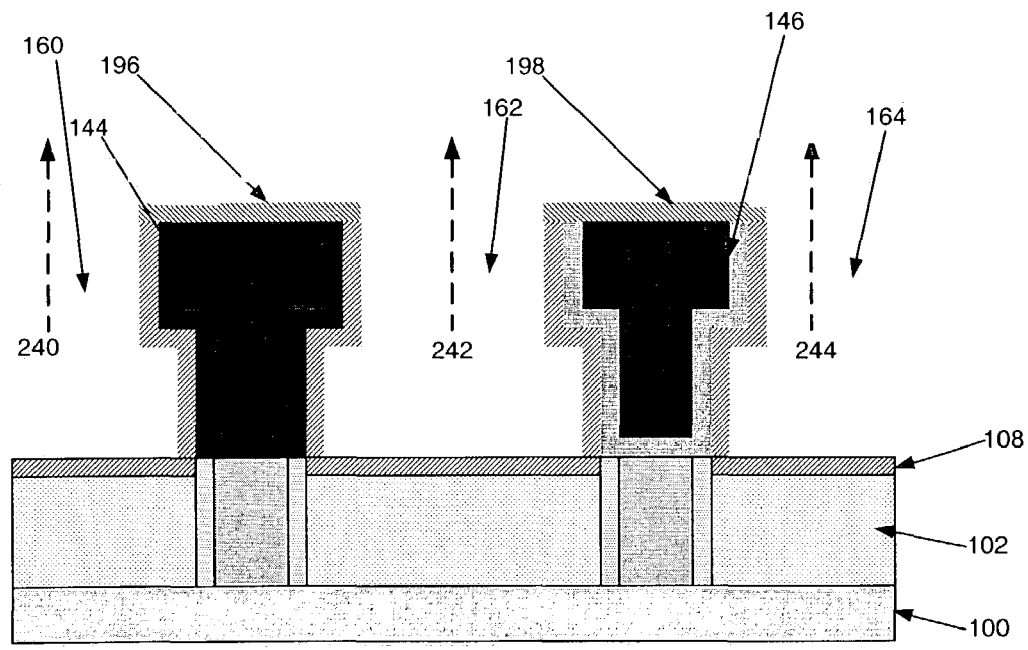

Referring to FIG. 1I, subsequent to a planarization treatment such as chemical mechanical planarization, distinct conductive layers (144, 146) are formed between the sacrificial dielectric layer portions (150, 152, 154). As shown in FIG. 1J, a protective layer (194) may then be formed adjacent the planarized surface and patterned to leave behind discrete portions (196, 198) of the protective layer (194). Referring to FIG. 1K, the discrete portions (196, 198) depicted in FIG. 1K have been patterned to provide protection of the underlying conductive layers (144, 146). The result of forming discrete conductive layers (144, 146) into sacrificial dielectric layer portions (150, 152, 154), as described above in reference to FIGS. 1B–1K, may be referred to as forming an interconnect sublayer (230), upon which other layers, such as other interconnect sublayers, or protective layers (196, 198) may be formed. Referring to FIG. 1L, the sacrificial dielectric layer portions (150, 152, 154) previously depicted in FIG. 1K have been decomposed and removed to leave behind voids, or "air gaps" (160, 162, 164), between the conductive layers (144, 146). The conversion from a structure similar to that of FIG. 1K, to one similar to that of FIG. 1L, preferably is accomplished as a two phase treatment comprising decomping the sacrificial material comprising the sacrificial dielectric layer portions (150, 152, 154) to form a decomposition, and removing the decomposition to leave behind air gaps. Preferably the sacrificial material is decomposed by applying a wet etchant, such as hydrofluoric acid, to selectively decompose, or dissolve, the sacrificial dielectric material without significantly damaging other associated structures, such as the etch stop layers (108, 130, 132, 134, 136). Sacrificial materials may also be selectively decomposed or dissolved using thermal or thermochemical techniques utilizing energy from heat, plasma, or both. Removing the decomposition preferably is accomplished by introducing a conventional water rinse, or by introducing a carrier plasma, such as an oxygen, hydrogen, or nitrogen rich plasma, as would be apparent to one skilled in the art. As depicted in FIG. 1L, the decomposition preferably is removed along the removal pathways (240, 242, 244) away from the substrate (100) to leave air gaps or voids (160, 162, 164) behind.

Figure 2A:
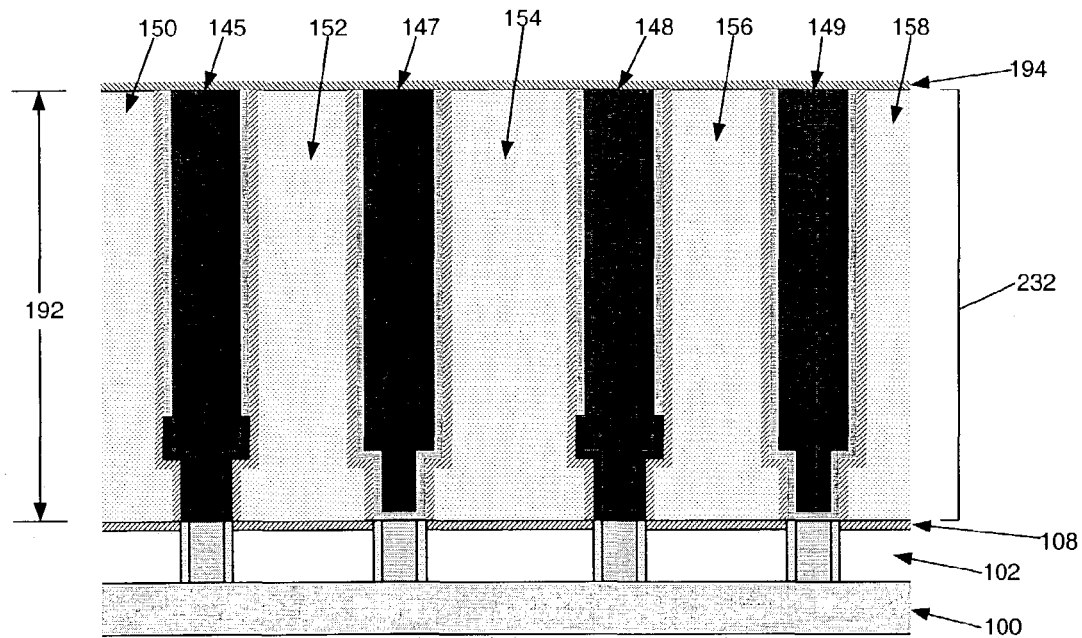
FIGS. 2A–2B depict cross-sectional views of various aspects of one embodiment of the present invention wherein peripheral structural layers are incorporated.
Figure 2B:
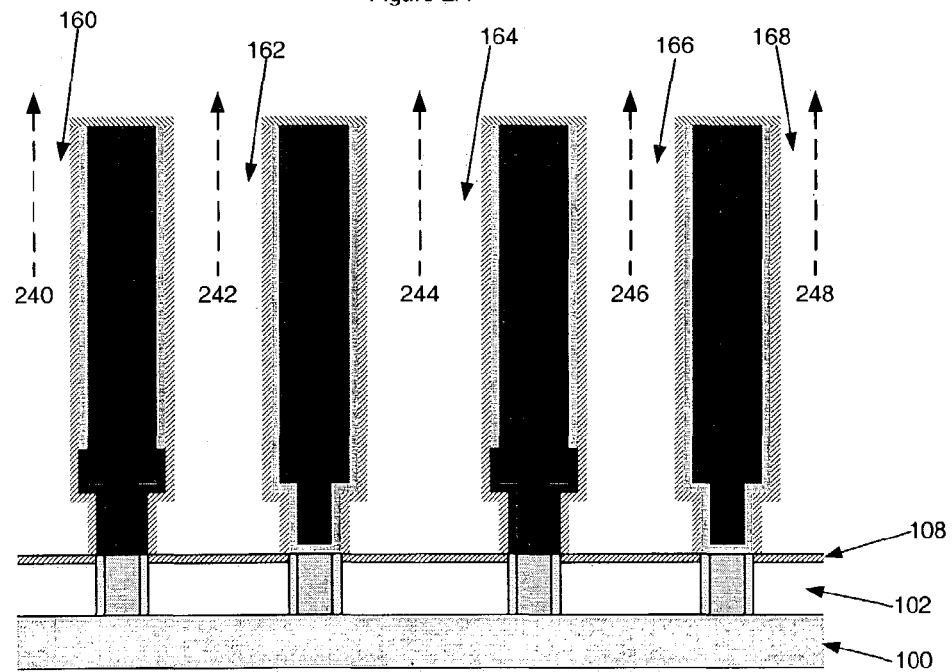

Such techniques and structures may be applied to form multi-level air gap integrations. For example, referring to FIG. 2A, a multi-level integration is depicted wherein conductive, or "metalization" in the case of metal conductive materials, layers such as those depicted in FIG. 1L (144, 146) are formed using various phases of patterning and electroplating or similar techniques to reside in vertical stacks, or conductive vertical series (145, 147, 148, 149), as shown in FIG. 2A, each conductive vertical series (145, 147, 148, 149) being isolated from others by intact sacrificial layer portions (150, 152, 154, 156, 158). Referring to FIG. 2A, several interconnect sublayers, such as between about 2 and about 6 sublayers, are stacked to collectively form a multi-layer interconnect (232). Each of the sublayers may be similar to those described, for example, in reference to a single interconnect sublayer (230) in FIG. 1K. Subsequent to formation of a structure comprising conductive vertical series (145, 147, 148, 149) separated by intact sacrificial dielectric layer portions (150, 152, 154, 156, 158) as depicted in FIG. 2A, the sacrificial dielectric layer portions (150, 152, 154, 156, 158) may be decomposed and removed along the depicted removal pathways (240, 242, 244, 246, 248), as depicted in FIG. 2B, to leave behind voids or air gaps (160, 162, 164, 166, 168). Side walls of the conductive vertical series (145, 147, 148, 149) define the air gaps (160, 162, 164, 166, 168) between the conductive vertical series (145, 147, 148, 149). In various embodiments, the side walls of the conductive vertical series (145, 147, 148, 149) may be the boundary of the conductive layers or the boundary of etch stop (130, 132, 134, 136) or barrier (138, 140) layers coating the conductive layers of the conductive vertical series (145, 147, 148, 149).

Figure 3A:
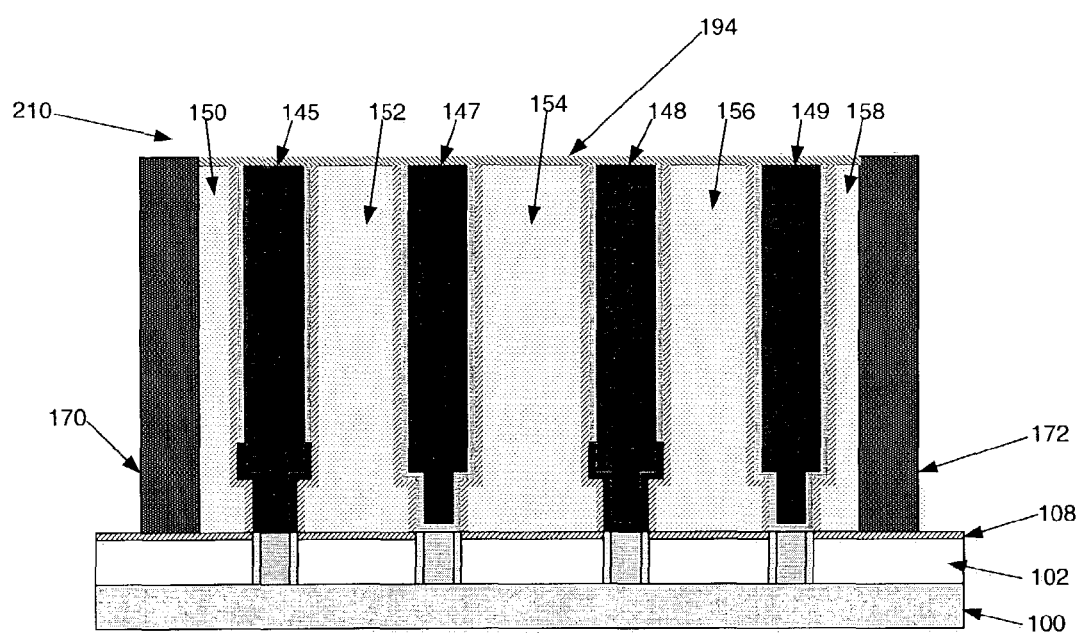
FIGS. 3A–3H depict cross-sectional views of various aspects of one embodiment of the present invention wherein a capping layer is incorporated.

Referring to FIG. 3A, a structure similar to that of FIG. 2A is depicted with the exception that peripheral structural layers (170, 172) have been formed on either side of the depicted cross section. The peripheral structural layers (170, 172) preferably comprise a dielectric material with a Young's modulus higher than about 50 Gpa to resist bending and deformation. They may be formed using successive sublayer deposition, as with the interconnect sublayers (230) depicted in FIGS. 1I–1K. In other words, subsequent to each deposition of a sublayer of sacrificial dielectric material, trenches may be formed for both conductive layers and peripheral structural sublayers. Preferred materials for the peripheral structural layers (170, 172) include but are not limited to silicon dioxide and silicon nitride, deposited using conventional techniques such as CVD or PECVD. The accumulation of interconnect sublayers buttressed by peripheral structural sublayers, followed by formation of a protective layer (194) may form a structure such as that depicted in FIG. 3A. As shown in FIG. 3A, the peripheral structural layers (170, 172) may be formed to protrude slightly more from the plane of the substrate layer (100) than the uppermost surfaces of the sacrificial dielectric layer portions (150, 152, 154, 156, 158) to facilitate a relatively planar surface (210) subsequent to forming the protective layer (194) between the two peripheral structural layers (170, 172).

Figure 3B:
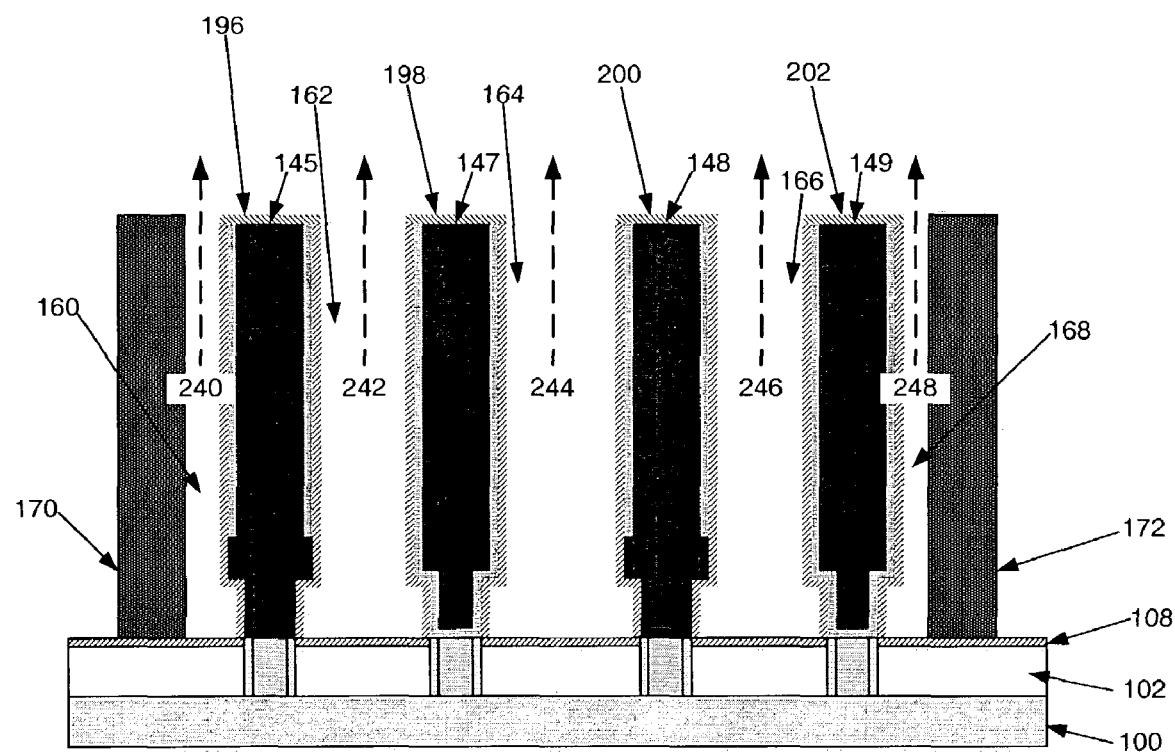

Referring to FIG. 3B, in a manner similar to that described in reference to FIGS. 1L and 2B, the depicted structure may result from patterning the protective layer (194) of FIG. 3A into discrete protective layer portions (196, 198, 200, 202) adjacent the depicted conductive vertical series (145, 147, 148, 149), decomposing portions of the sacrificial dielectric layer portions (150, 152, 154, 156, 158), and removing the decomposition using the disclosed techniques. Throughout the decomposing the removing treatments, the conductive vertical series (145, 147, 148, 149) remain isolated from associated chemistries by the sacrificial dielectric layer portions (150, 152, 154, 156, 158) and the remaining portions of previously deposited etch stop and barrier layers, similar to those depicted in FIG. 1G (130, 138). The decomposition preferably is removed away from the direction of the substrate layer (100) along the depicted pathways (240, 242, 244, 246, 248) to leave behind air gaps or voids (160, 162, 164, 166, 168).

Subsequent to removal of the sacrificial material, a structure such as that depicted in FIG. 3B may be somewhat unstable in terms of its ability to withstand loads and resist unwanted deflection. In particular, each of the conductive vertical series (145, 147, 148, 149) may susceptible to undesirable levels of cantilever bending during subsequent process treatments such as chemical mechanical polishing upon subsequently formed layers. To bolster the structure, and also to prevent introduction of subsequently deposited materials into the air gaps (160, 162, 164, 166, 168), one or more capping layers may be added.

Figure 3C:
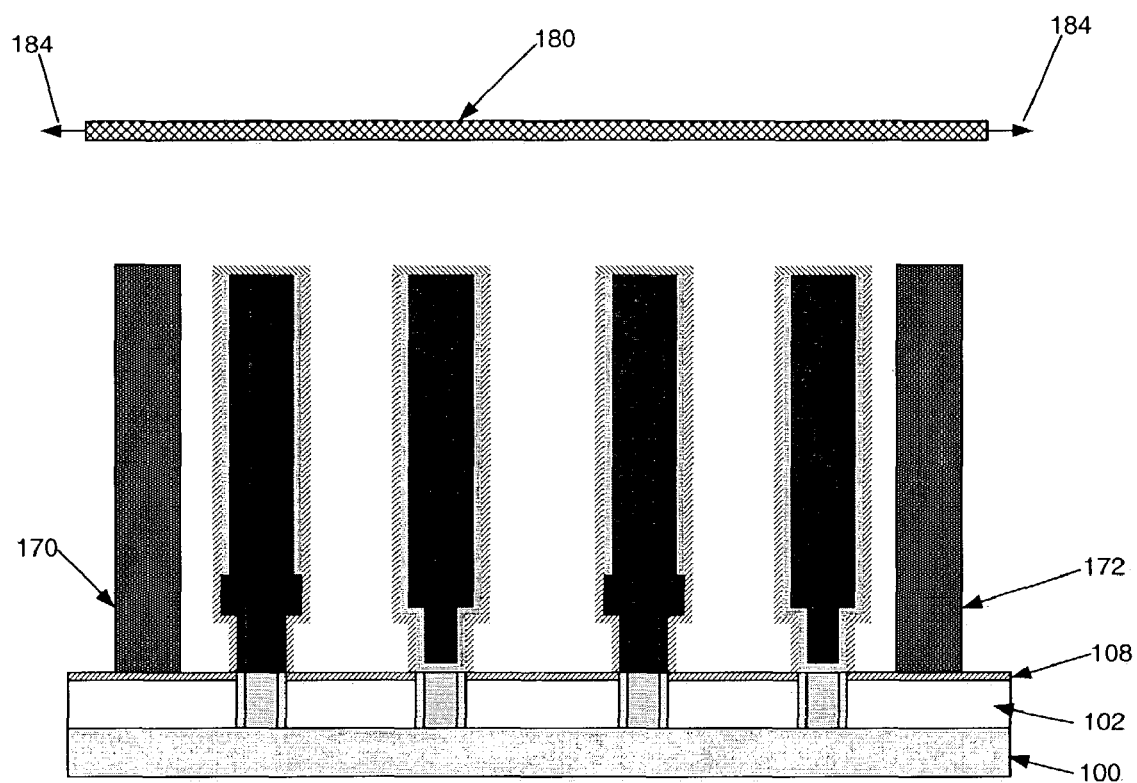
Figure 3D:
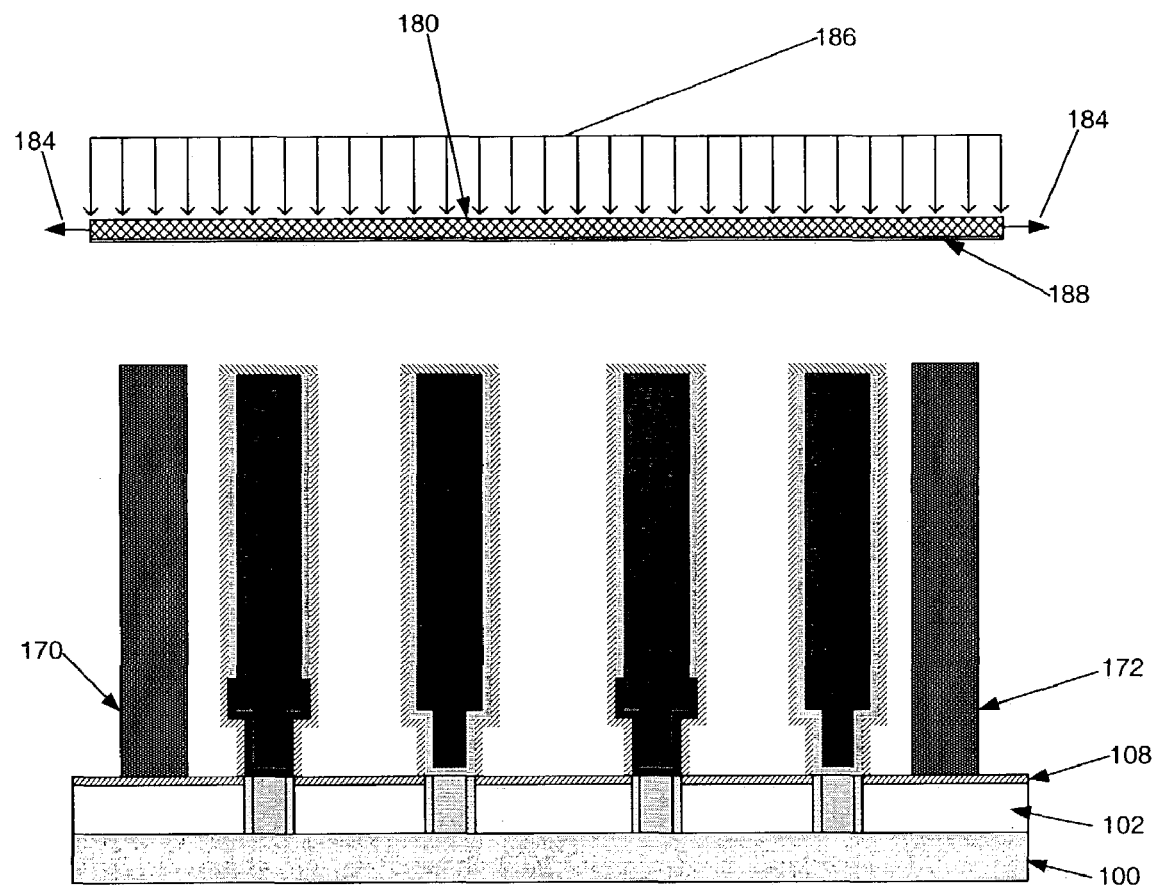
Figure 3E:
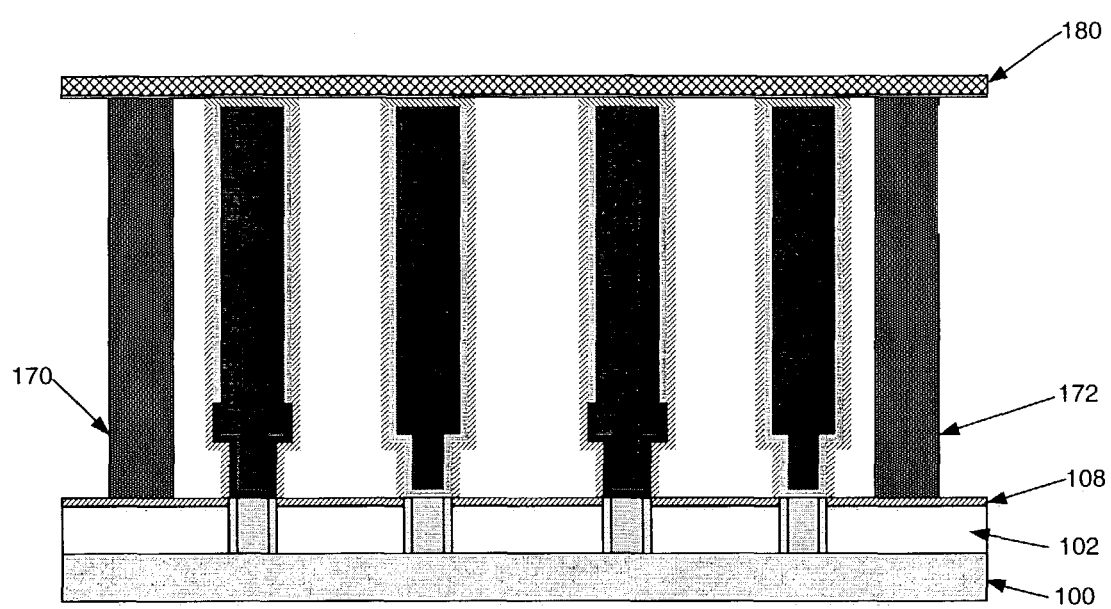

Referring to FIG. 3C, one embodiment incorporates a first capping layer (180) comprising a relatively low Young's modulus polymeric material, such as polyimide or a packaging polymeric material such as a benzocyclobutene-based polymer material, sold, for example, under the tradename "Cyclotene™" by Dow Chemical Corporation, stretched over and adhered to the uppermost surfaces of the structure, namely the peripheral structural layers (170, 172) and uppermost surfaces of the discrete protective layer portions (196, 198, 200, 202) adjacent the depicted conductive vertical series (145, 147, 148, 149). The first capping layer (180) material is placed under a tensile load (184) and coated with an adhesion promoter (188) such as hexamethyldisiloxane (HDMS) before it is positioned adjacent such surfaces. Referring to FIG. 3D, the first capping layer (180) may be pushed into place using a highly distributed load (186), such as a series of fluid or air jets. Such techniques are conventionally utilized in the preparation of thin film masks for semiconductor processing. A resultant depiction of such positioning with this embodiment is shown in FIG. 3E. The first capping layer (180) as depicted in this embodiment preferably has a thickness between about 5 and about 25 microns. A conventional heating process may be utilized to evacuate solvents and cure polymer materials.

Figure 3F:
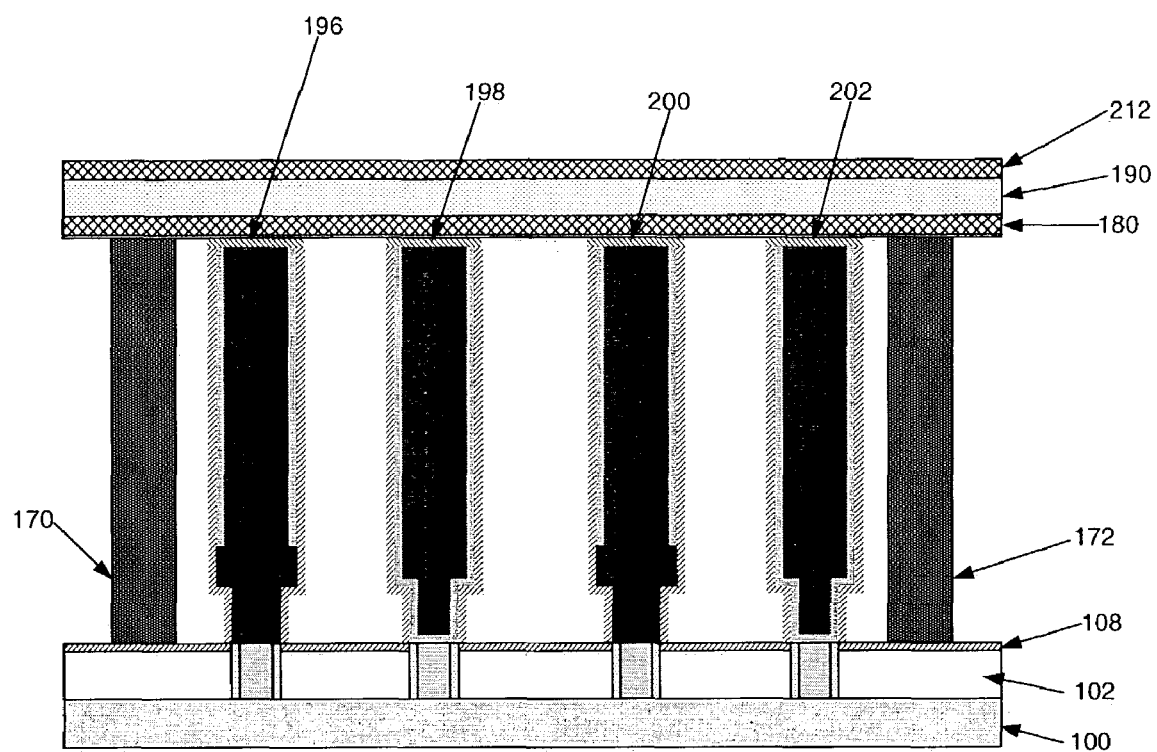

Referring to FIG. 3F, additional capping layers may be added for added structural rigidity and potential contact formation. In the depicted embodiment, a second capping layer (190) is formed adjacent the first capping layer (180), the second capping layer preferably having a Young's modulus greater than about 50 GPa and comprising a material such as silicon nitride or silicon dioxide deposited at a thickness of around 2 microns using conventional techniques such as CVD or PECVD. Subsequent to formation of the second capping layer (190), a third capping layer (212) may also be formed for added protection In the depicted embodiment, the third capping layer (212) comprises another layer of polymeric material similar to the first capping layer, formed using similar techniques.

Figure 3G:
Figure 3H:
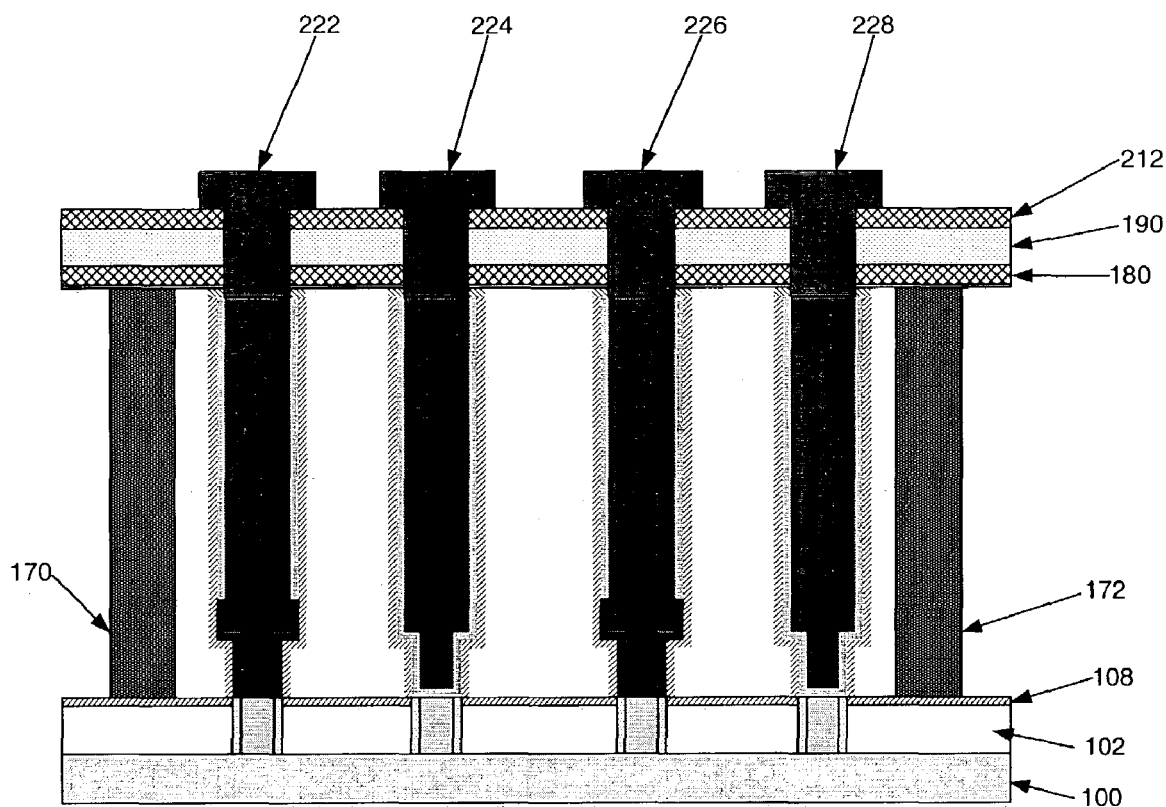

Referring to FIGS. 3F, 3G, and 3H, the three capping layers (180, 190, 212) may be utilized to facilitate formation and support of a contact, such as a conventional C4 contact. As shown in FIG. 3G, the three capping layers (180, 190, 212) and underlying protective layer portions shown intact in FIG. 3F (196, 198, 200, 202) may be patterned using conventional techniques to gain access to the underlying conductive materials. Subsequently, C4 or similar contacts (222, 224, 226, 228) may be formed using conventional techniques, such as patterning and electroplating subsequent to appropriate under-ball-metallurgy deposition, as would be apparent to one skilled in the art.

Thus, a novel microelectronic integration solution is disclosed. Although the invention is described herein with reference to specific embodiments, many modifications therein will readily occur to those of ordinary skill in the art. Further, the foregoing description of embodiments of the invention and the claims following include terms, such as left, right, over, under, upper, lower, first, second, etc. that are used for descriptive purposes only and are not to be construed as limiting. The embodiments of a device or article described herein can be manufactured, used, or shipped in a number of positions and orientations. Accordingly, all such variations and modifications are included within the intended scope of the invention as defined by the following claims.

The invention claimed is:

1. A method to form an air gap interconnect structure comprising:

forming a multi-layer interconnect adjacent a substrate layer, the interconnect comprising conductive layers positioned in at least two conductive vertical series, the conductive vertical series isolated from each other by sacrificial dielectric material;

forming a protective layer adjacent the interconnect;

patterning the protective layer to expose portions of the sacrificial dielectric material;

decomposing portions of the sacrificial dielectric material to form a sacrificial dielectric decomposition product;

removing portions of the sacrificial dielectric decomposition product to form air gaps between the conductive layers; and wherein forming a multi-layer interconnect comprises;

forming a first layer of sacrificial dielectric material, forming trenches in the first layer, and filling the trenches with conductive material to form at least two conductive layers isolated from each other by the sacrificial dielectric material; and forming a second layer of sacrificial dielectric material adjacent the at least two conductive layers and fist layer, forming trenches in the second layer in substantial vertical alignment with the trenches of the first layer, and filling the trenches with conductive material to form at least two additional conductive layers isolated from each other by the second sacrificial dielectric material and forming vertical support structures peripheral to the conductive vertical series, wherein removing portions of the sacrificial dielectric decomposition product further forms air gaps between the vertical support structures and the conductive vertical series.

2. The method of claim 1 wherein decomposing comprises decomposing substantially all of the sacrificial dielectric material between each of the vertical series at approximately the same time.

3. The method of claim 2 wherein removing comprises removing substantially all of the sacrificial dielectric material between each of the vertical series.

4. The method of claim 1 further comprising forming, above air gaps between the conductive layers, a first capping layer to contact the vertical support structures and surfaces of the most highly positioned conductive layers within each conductive vertical series or the protective layer on each conductive vertical series.

5. The method of claim 4 further comprising forming a second capping layer adjacent the first capping layer.

6. The method of claim 5 further comprising forming a third capping layer adjacent the second capping layer.

7. The method of claim 6 further comprising forming a contact structure through the protective layer and first, second, and third capping layers to contact an underlying conductive layer.

8. The method of claim 7 wherein the contact structure comprises a metallic C4 structure.

9. The method of claim 6 wherein the third capping layer comprises polyimide or a benzocyclobutene-based polymer.

10. The method of claim 5 wherein the second capping layer comprises a material selected from the group consisting of silicon dioxide, silicon nitride, and silicon oxynitride.

11. The method of claim 4 wherein the first capping layer comprises polyimide or a benzocyclobutene-based polymer.

12. An air gap interconnect structure comprising:
a. a substrate layer;
b. at least two conductive vertical series adjacent the substrate layer, each conductive vertical series comprising a plurality of conductive layers, wherein the conductive vertical series are isolated from each other by air gaps defined by side walls of the conductive vertical series;
c. vertical support structures peripheral to the conductive vertical series and isolated from the conductive vertical series by air gaps wherein none of the peripheral vertical support structures are between the at least two conductive vertical series; and
d. a capping layer adjacent to and above upper surfaces of the vertical support structures and the conductive vertical series.

13. The structure of claim 12 wherein each conductive vertical series comprises between about 2 and about 6 conductive layers.

14. The structure of claim 12 wherein the vertical support structures peripheral to the conductive vertical series protrude slightly more from the plane of the substrate layer than the uppermost conductive layer in the conductive vertical series.

15. The structure of claim 12 further comprising a contact structure extending through the capping layer to contact an underlying conductive layer of a conductive vertical series.

16. An air gap interconnect structure comprising:
a substrate layer;
a first conductive vertical series adjacent the substrate layer having a plurality of conductive layers, and having a first side wall and a second side wall, each side wall extending substantially perpendicularly from the substrate layer;
a second conductive vertical series adjacent the substrate layer having a plurality of conductive layers, and having a first side wall and a second side wall, each side wall extending substantially perpendicularly from the substrate layer;
layers of silicon nitride on each of the first and second side walls of the first conductive vertical series and the first and second side walls of the second conductive vertical series; and
at least one peripheral vertical support structure, wherein no peripheral vertical support structure is between the first and second conductive vertical series.

17. A method to form an air gap interconnect structure comprising:
forming a first layer of sacrificial dielectric material, forming trenches in the first layer, and filling the trenches with conductive material to form at least two conductive layers isolated from each other by remaining portions of the first layer of sacrificial dielectric material;
forming a second layer of sacrificial dielectric material adjacent the at least two conductive layers and the remaining portions of the first layer of sacrificial dielectric material, forming trenches in the second layer in substantial vertical alignment with the trenches of the first layer, and filling the trenches with conductive material to form at least two additional conductive layers isolated from each other by remaining portions of the second layer of sacrificial dielectric material; and
removing, after forming the first and second layers, at least some of the remaining portions of the first layer of sacrificial dielectric material and at least some of the remaining portions of the second layer of sacrificial dielectric material to form air gaps between the conductive layers positioning a first capping layer adjacent to the surfaces of the two additional conductive layers and applying a tensile load in a direction substantially parallel to a substrate layer to the first capping layer such that the first capping layer is adhered to the two additional conductive layers separated by the air gap.

18. The method of claim 17 wherein the conductive layers comprise copper.

19. The method of claim 17 wherein the first and second layers of the sacrificial dielectric material comprise a material selected from the group consisting of silicon dioxide, silicon oxynitride, and silicon oxyfluoride.

20. The method of claim 17, further comprising:
forming a protective layer adjacent the at least two additional conductive layers; and
patterning the protective layer to expose portions of the second layer of sacrificial dielectric material.

21. The method of claim 20 wherein the protective layer comprises silicon carbide.

22. The method of claim 17, wherein removing at least some of the remaining portions of the first and second layers of sacrificial dielectric material comprises:
decomposing portions of the sacrificial dielectric material to form a sacrificial dielectric decomposition product; and
removing portions of the sacrificial dielectric decomposition product to form air gaps between the conductive layers.

23. The method of claim 22 wherein decomposing comprises introducing a chemical agent comprising hydrofluoric acid.

24. The method of claim 22 wherein removing comprises introducing water.

25. The method of claim 22 wherein removing comprises introducing a carrier plasma.

* * * * *

UNITED STATES PATENT AND TRADEMARK OFFICE
CERTIFICATE OF CORRECTION

PATENT NO. : 6,995,073 B2 Page 1 of 1
APPLICATION NO. : 10/621696
DATED : February 7, 2006
INVENTOR(S) : Liou It is certified that error appears in the above-identified patent and that said Letters Patent is hereby corrected as shown below:

In column 2, at line 42, delete "(10)" and insert --(110)--.
In column 2, at line 42, delete "(10)" and insert --(110)--.
In column 2, at line 46, delete "(10)" and insert --(110)--.
In column 6, at line 49, delete ";" and insert --:--.
In column 14, at line 53, delete "50 Gpa" and insert --50Gpa--.

Signed and Sealed this

Thirtieth Day of October, 2007

JON W. DUDAS
*Director of the United States Patent and Trademark Office*